US012721020B2

(12) United States Patent
Chiang et al.

(10) Patent No.: US 12,721,020 B2
(45) Date of Patent: Aug. 25, 2026

(54) AUTOMOTIVE OLED DISPLAY SCREEN

(71) Applicant: AENEQ DISPLAY CO., LTD., Jiaxing (CN)

(72) Inventors: Cheng-Chung Chiang, Jiaxing (CN); Hao-Yu Chou, Tainan (CN); Yeaw Sing Lai, Ampang Selangor (MY); Yongfeng Shi, Suzhou (CN); Chien-Chih Chiang, Taipei (CN)

(73) Assignee: AENEQ DISPLAY CO., LTD., Jiaxing (CN)

( * ) Notice: Subject to any disclaimer, the term of this patent is extended or adjusted under 35 U.S.C. 154(b) by 514 days.

(21) Appl. No.: 18/135,780

(22) Filed: Apr. 18, 2023

(65) Prior Publication Data

US 2023/0263036 A1 Aug. 17, 2023

Related U.S. Application Data

(63) Continuation of application No. PCT/CN2020/127986, filed on Nov. 11, 2020.

(30) Foreign Application Priority Data

Aug. 25, 2020 (CN) ........................ 202010864624.3

(51) Int. Cl.
*H10K 59/80* (2023.01)
*G09F 9/30* (2006.01)
(Continued)

(52) U.S. Cl.
CPC ......... *H10K 59/8793* (2023.02); *G09F 9/301* (2013.01); *H10K 50/84* (2023.02);
(Continued)

(58) Field of Classification Search
CPC .. H10K 59/8793; H10K 71/00; H10K 59/873; H10K 2102/311; H10K 59/40; H10K 59/8722; G09F 9/301
See application file for complete search history.

(56) References Cited

U.S. PATENT DOCUMENTS 9,977,466 B2 * 5/2018 Kwon .................. G06F 1/1652
10,212,811 B1 * 2/2019 Zhang .................. H05K 1/028
(Continued)

FOREIGN PATENT DOCUMENTS

CN 106910429 A 6/2017
CN 108264848 A 7/2018
(Continued)

OTHER PUBLICATIONS

International search report of PCT Patent Application No. PCT/CN2020/127986 issued on May 8, 2021.

*Primary Examiner* — Alonzo Chambliss

(57) ABSTRACT

The present invention relates to the field of screen display technology, and discloses an automotive organic light-emitting diode (OLED) display screen, including a foldable OLED panel. The foldable OLED panel is of a rectangular structure and includes a display panel end and a folding region. The folding region is folded outwards to form a folded panel end. The foldable OLED panel is provided with at least one folded panel end. A back of the display panel end is bonded and fixed to the folded panel end. A circular polarizer is attached to a surface of the display panel end via an optical adhesive. A protective cover plate is attached to a surface of the circular polarizer via an optical adhesive.

11 Claims, 11 Drawing Sheets

(51) Int. Cl.

| | |
|---|---|
| ***H10K 50/84*** | (2023.01) |
| ***H10K 59/40*** | (2023.01) |
| ***H10K 71/00*** | (2023.01) |
| ***H10K 77/10*** | (2023.01) |
| *H10K 102/00* | (2023.01) |

(52) U.S. Cl.
CPC ............. *H10K 59/40* (2023.02); *H10K 59/87* (2023.02); *H10K 59/873* (2023.02); *H10K 71/00* (2023.02); *H10K 77/111* (2023.02); *H10K 2102/311* (2023.02)

(56) References Cited

U.S. PATENT DOCUMENTS

| | | | | |
|---|---|---|---|---|
| 10,978,494 | B2 * | 4/2021 | An | H10K 59/131 |
| 11,169,403 | B2 * | 11/2021 | Li | G09F 9/301 |
| 11,380,868 | B2 * | 7/2022 | Qi | H10K 59/873 |
| 2019/0326529 | A1 * | 10/2019 | Xie | H01L 21/78 |
| 2020/0028133 | A1 * | 1/2020 | Stone | H01G 11/82 |
| 2022/0190304 | A1 * | 6/2022 | Zhu | H10K 59/40 |

FOREIGN PATENT DOCUMENTS

| | | | | |
|---|---|---|---|---|
| CN | 110718159 | A | 1/2020 | |
| CN | 209920740 | U | 1/2020 | |
| CN | 210759734 | U | 6/2020 | |
| CN | 210759735 | U | 6/2020 | |
| CN | 111443829 | A | 7/2020 | |
| CN | 212257460 | U | 12/2020 | |
| WO | WO-2019144452 | A1 * | 8/2019 | H01L 23/562 |

* cited by examiner

AUTOMOTIVE OLED DISPLAY SCREEN

CROSS REFERENCE TO RELATED APPLICATION

This application is a continuation application of PCT international application No. PCT/CN2020/127986 filed on Nov. 11, 2020, which claims the benefit of Chinese Patent Application No. 202010864624.3 filed on Aug. 25, 2020. The contents of all of the aforementioned applications are incorporated by reference herein in their entirety.

FIELD OF TECHNOLOGY

The present invention relates to the field of screen display technology, and discloses an automotive organic light-emitting diode (OLED) display screen and a method for manufacturing the same.

BACKGROUND

The manufacturing technology for flexible OLED display screens has tended to be mature, and folding phones have also been officially launched on the market. In terms of automotive displays, there is a tendency to the use of larger and more display screens in cars. Nowadays, various brands of cars on sale basically have at least one large central control screen with different sizes. High profile or high-end cars tend to adopt a display-type dashboard, which can provide users with a lot of convenience. However, liquid crystal display (LCD) screens are mostly adopted as automotive display screens due to their affordable prices. The LCD screens, limited by their own characteristics, are abruptly installed above center consoles in cars such as Audi A3 and A4 and Mercedes C class, so that the internal appearance gets directly influenced and the screen size may also be limited.

Flexible OLED displays can match well with various radians of automotive interiors due to the flexibility, which contributes to improved appearance and better display effects, and thus make the flexible OLED displays be the development trend of future automotive displays. The manufacturer of Mercedes-Benz has recently announced that an upcoming 2021 S-class car will include up to five touch screens, one of which is a 12.8-inch OLED display screen with tactile feedback. This kind of OLED display screen will become a standard for all cars in this series. Virtual exterior rearview mirrors of Audi e-Tron are equipped with OLEDs from Samsung displays and installed on left and right sides of a car dashboard to serve as cameras and existing side view mirrors. Built-in touch sensors allow users to zoom in or out screens by touch like smart phones.

The primary problem with the use of flexible OLEDs in automotive display screens is higher price due to that firstly, the customization of flexible OLED screens with special shapes and sizes requires mold opening costs of 30-50 million yuan for all molds and fixtures in only a manufacturing process; and secondly, the usage amount is relatively small, for example, a model of mobile phones requires millions, tens of millions, or even hundreds of millions of screens per year, while for a single car model, there are only 200,000 or 300,000 cars sold even in a year of high sales.

SUMMARY

An objective of the present invention is to provide an automotive OLED manufactured from a flexible OLED with a universal size, and a method for manufacturing the automotive OLED.

The above technical objective of the present invention is achieved by the following technical solutions:

An automotive OLED display screen includes a foldable OLED panel, where the foldable OLED panel is of a rectangular structure and includes a display panel end and a folding region, the folding region is folded outwards to form a folded panel end, and the foldable OLED panel is provided with at least one folded panel end;

a back of the display panel end is bonded and fixed to the folded panel end;

a circular polarizer is attached to a surface of the display panel end via an optical adhesive; and a protective cover plate is attached to a surface of the circular polarizer via an optical adhesive.

Further, the foldable OLED panel is provided with at least two folded panel ends; and fold axes of the folded panel ends are not crossed with each other.

Further, the protective cover plate includes ultra-thin glass, an explosion-proof film is arranged on a surface of the ultra-thin glass, a first polyethylene terephthalate (PET) plastic film is attached to a surface of the explosion-proof film via an optical adhesive, a surface of the first PET plastic film is coated with a hardened anti-fouling film, and the ultra-thin glass is bonded to the polarizer via an optical adhesive.

Further, a lead wire region is arranged at an end part of the folded panel end.

Further, a second PET plastic film is attached to a surface of the folded panel end via an optical adhesive.

Further, the foldable OLED panel is provided with two folded panel ends, and the folded panel ends are formed by folding two opposite edges outwards.

Further, the foldable OLED panel is provided with two, three or four folded panel ends, and the folded panel ends are formed by folding two, three or four corners outwards.

Further, the folded panel ends are formed by folding at least an edge and at least one corner outwards.

Further, an automotive display outer frame is fixed to an outer side of the display panel end, is in contact with the folded panel end and is located on an outer side of the circular polarizer, an extension portion is arranged on a top surface of the automotive display outer frame, and the extension portion extends towards the display panel end and presses the foldable OLED panel.

Further, the folded panel ends of the foldable OLED panel have mutually stacked parts, and the stacked parts of the folded panel ends are mutually stacked and bonded via an optical adhesive.

A method for manufacturing an automotive OLED display screen includes the following steps:

a): firstly, manufacturing a foldable OLED panel of a standard specification, having a size such as 15 inches, 12 inches, 10 inches, 8 inches, and 6 inches, where the foldable OLED panel includes a polyimide (PI) layer, a thin film transistor (TFT) layer, an OLED layer, an encapsulation layer, and a touch control layer;

b): selecting the foldable OLED panel with the closest size according to a target size of automotive display, and then folding excess parts of the foldable OLED panel outwards, which means that the foldable OLED panel has at least one folded panel end, where a folded front surface has the target size of the automotive OLED panel and is the display panel end;

c): fixing the folded panel end to a back surface of the display panel end via an optical adhesive, where an end part of the folded panel end contains a lead wire region of the display panel end;

d): attaching a circular polarizer to a surface of the display panel end via an optical adhesive; and e): attaching a protective cover plate to a surface of the circular polarizer via an optical adhesive.

Further, the protective cover plate includes ultra-thin glass, a surface of the ultra-thin glass is coated or printed with an explosion-proof film, a PET plastic film is attached to a surface of the explosion-proof film via an optical adhesive, and a surface of the PET plastic film is coated with a hardened anti-fouling film.

In summary, the present invention has the following beneficial effects:

1. The foldable OLED panel of a general specification, having a size such as 15 inches, 12 inches, 10 inches, 8 inches, and 6 inches, can be manufactured with a greatly reduced cost and a higher yield rate compared with an OLED panel having a customized shape.
2. The automotive OLED display screen manufactured by this solution is flexible and foldable, and may achieve the effect of an arc-shaped screen or a folding screen according to the actual need for a car.
3. The circular polarizer and the protective cover plate are accurately cut by laser to be in the shape of the target automotive display screen, so that the yield rate of a separate manufacturing process is higher.
4. The circular polarizer and the protective cover plate do not need to be attached to a folding part, so that the overall thickness is greatly reduced and a fold R angle is smaller.
5. A black matrix (BM) bezel may be omitted from the folding region or is folded to the back surface, so that the screen-to-body ratio of the folded automotive display screen may be increased to a certain extent.
6. The second PET plastic film is attached to the surface of the folded panel end, so that the folding part may be protected to a certain extent; and the protective cover plate may effectively protect the display panel end.

Names of corresponding components denoted by numbers and letters in the figures are as follows:

10. foldable OLED panel; 20. display panel end; 30. folded panel end; 40. circular polarizer; 50. protective cover plate; 60. lead wire region; 70. second PET plastic film; 80. automotive display outer frame; 501. ultra-thin glass; 502. explosion-proof film; 503. first PET plastic film; and 504. hardened anti-fouling film.

DESCRIPTION OF THE EMBODIMENTS

To make the technical means, creative features, achieved objective, and effects of the present invention easy to understand, the present invention is further described below in conjunction with the drawings and the specific embodiments.

Embodiment 1

Figure 1:
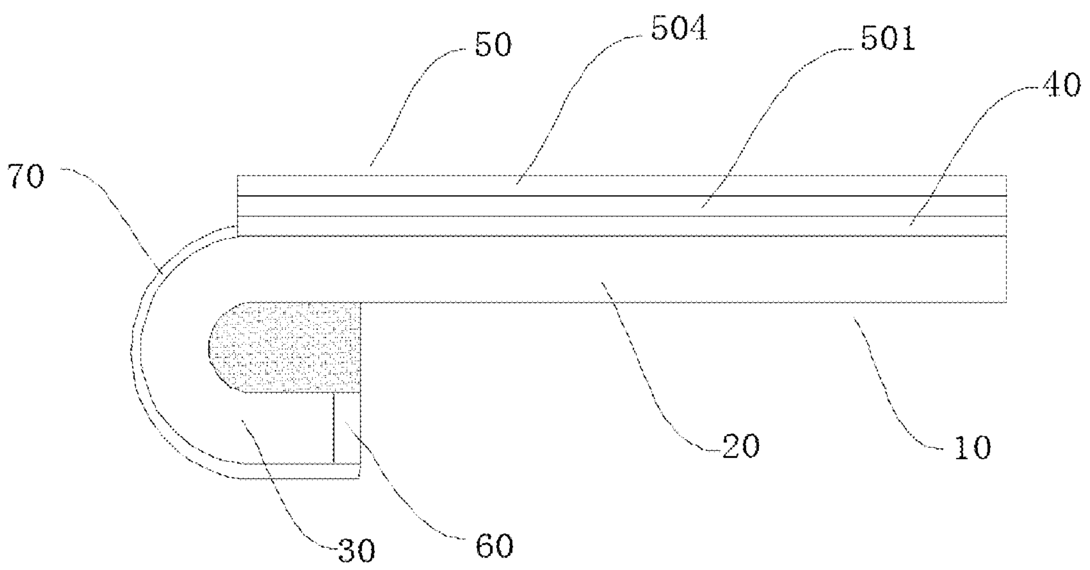
FIG. 1 is a schematic structural diagram of Embodiment 1 of the present invention.
Figure 4:
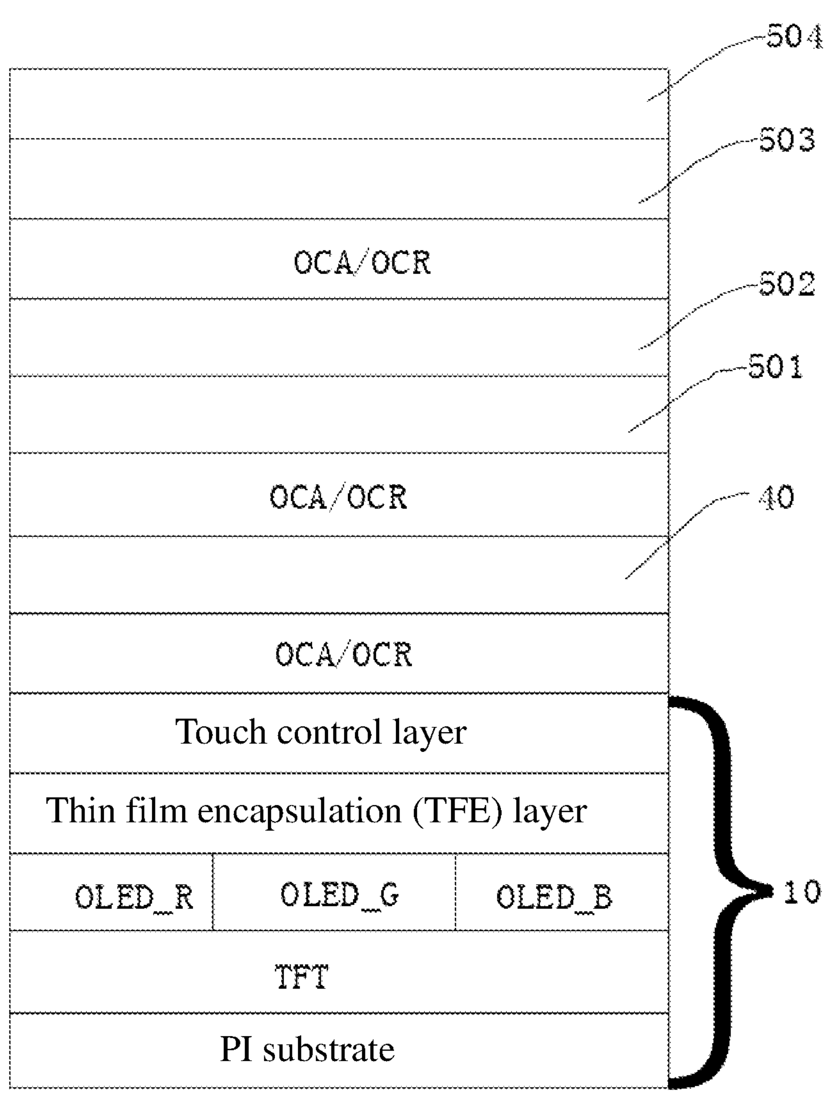
FIG. 4 is a schematic structural diagram of a protective cover plate in the present invention.
Figure 5:
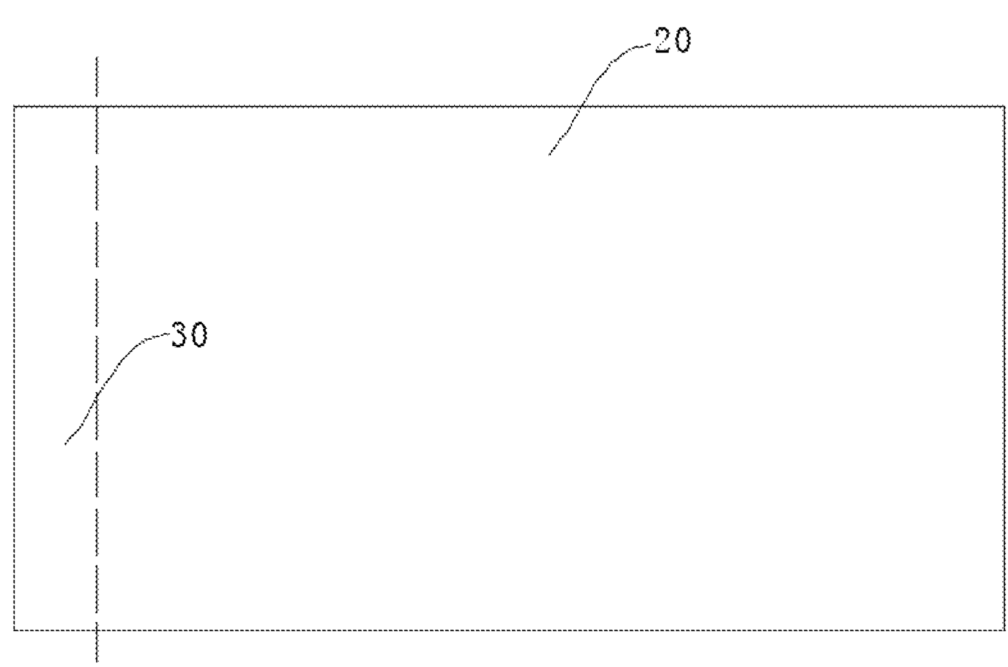
FIG. 5 is a schematic structural diagram of a display panel end and a folded panel end in Embodiment 1 of the present invention.

As shown in FIG. 1, FIG. 4, and FIG. 5, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with one folded panel end 30, and the folded panel end 30 is formed by folding one edge outwards; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, an explosion-proof film 502 is arranged on a surface of the ultra-thin glass 501, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 2

Figure 2:
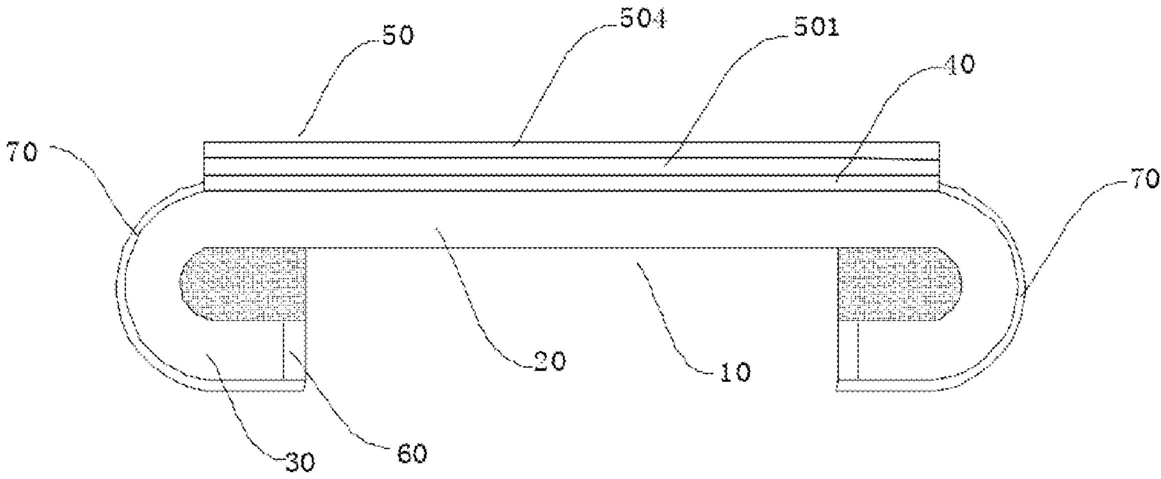
FIG. 2 is a schematic structural diagram of Embodiment 2 of the present invention.
Figure 6:
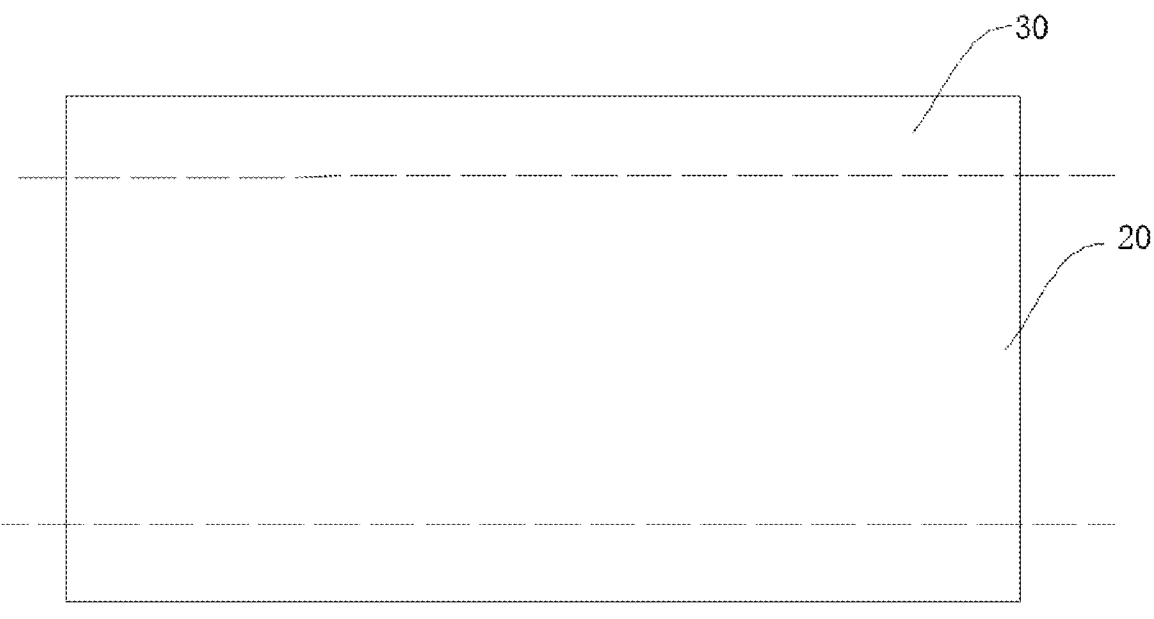
FIG. 6 is a schematic structural diagram of a display panel end and a folded panel end in Embodiment 2 and Embodiment 3 of the present invention.

As shown in FIG. 2, FIG. 4, and FIG. 6, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with two folded panel ends 30, the folded panel ends 30 are formed by folding two opposite edges outwards, and fold axes of the two folded panel ends 30 are not crossed with each other; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 3

Figure 3:
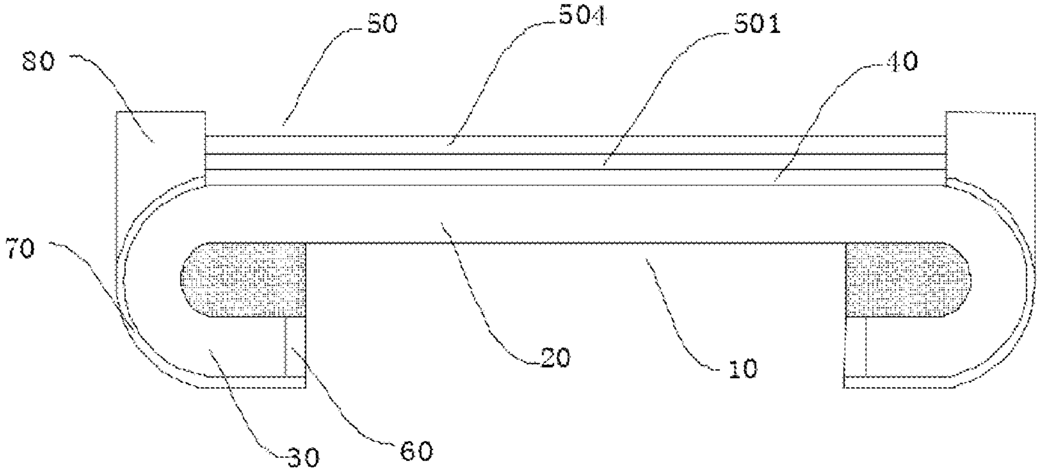
FIG. 3 is a schematic structural diagram of Embodiment 3 of the present invention.

As shown in FIG. 3, FIG. 4, and FIG. 6, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with two folded panel ends 30, the folded panel ends 30 are formed by folding two opposite edges outwards, and fold axes of the two folded panel ends 30 are not crossed with each other; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; a second PET plastic film 70 is attached to a surface of the folded panel end 30 via an optical adhesive; and an automotive display outer frame 80 is fixed to an outer side of the display panel end 20, is in contact with the folded panel end 30 and is located on an outer side of the circular polarizer 40, and an extension portion is arranged on a top surface of the automotive display outer frame 80, extends towards the display panel end 20 and presses the foldable OLED panel 10.

Embodiment 4

Figure 7:
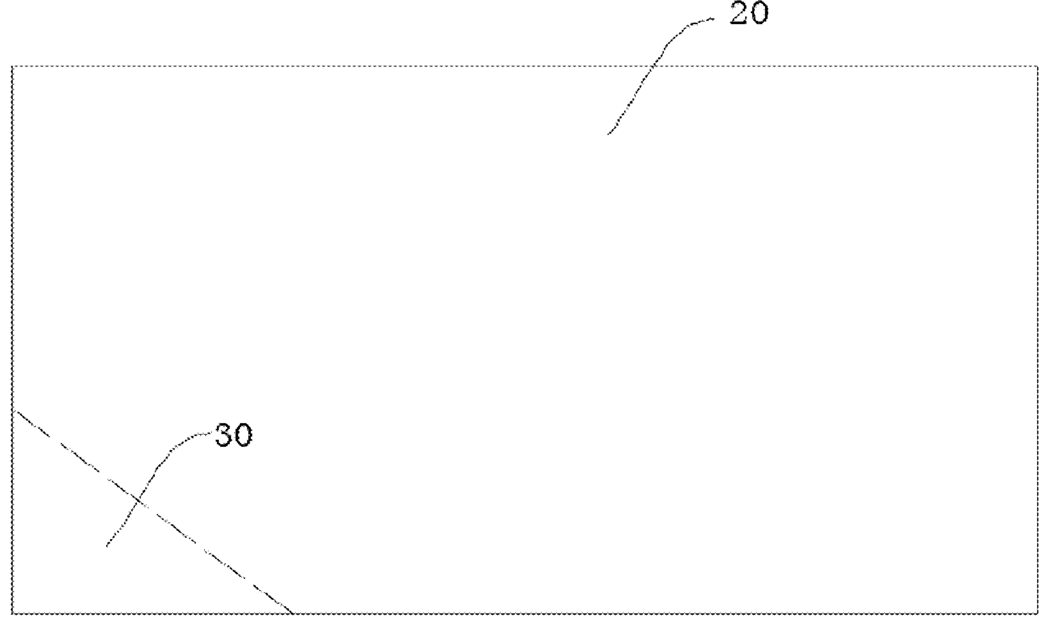
FIG. 7 is a schematic structural diagram of a display panel end and a folded panel end in Embodiment 4 of the present invention.

As shown in FIG. 7, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with one folded panel end 30, and the folded panel end 30 is formed by folding one corner outwards; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 5

Figure 8:
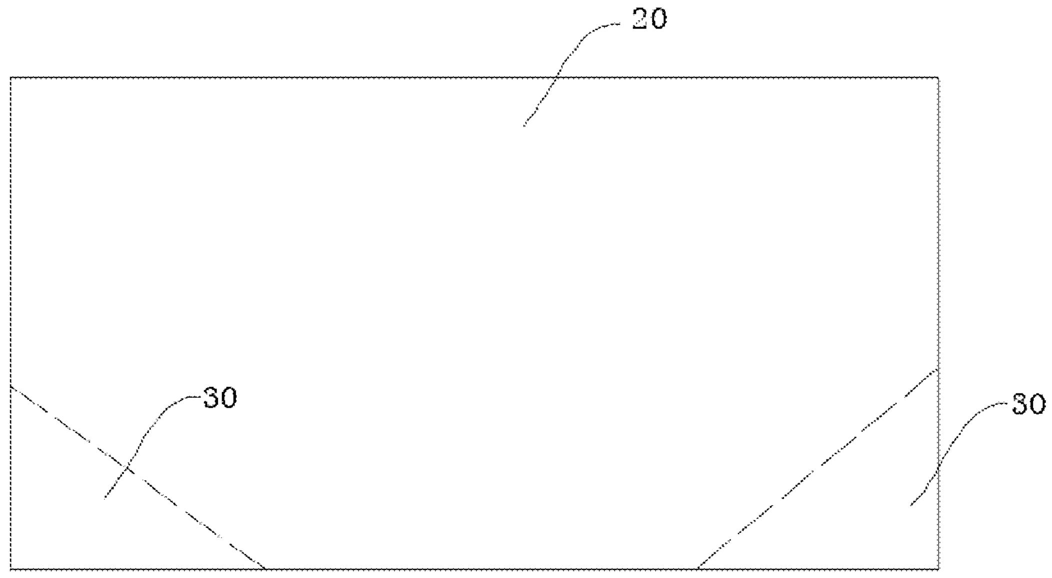
FIG. 8 is a schematic structural diagram of a display panel end and a folded panel end in Embodiment 5 of the present invention.

As shown in FIG. 8, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with two folded panel ends 30, the folded panel ends 30 are formed by folding two corners outwards, and fold axes of the two folded panel ends 30 are not crossed with each other; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 6

Figure 9:
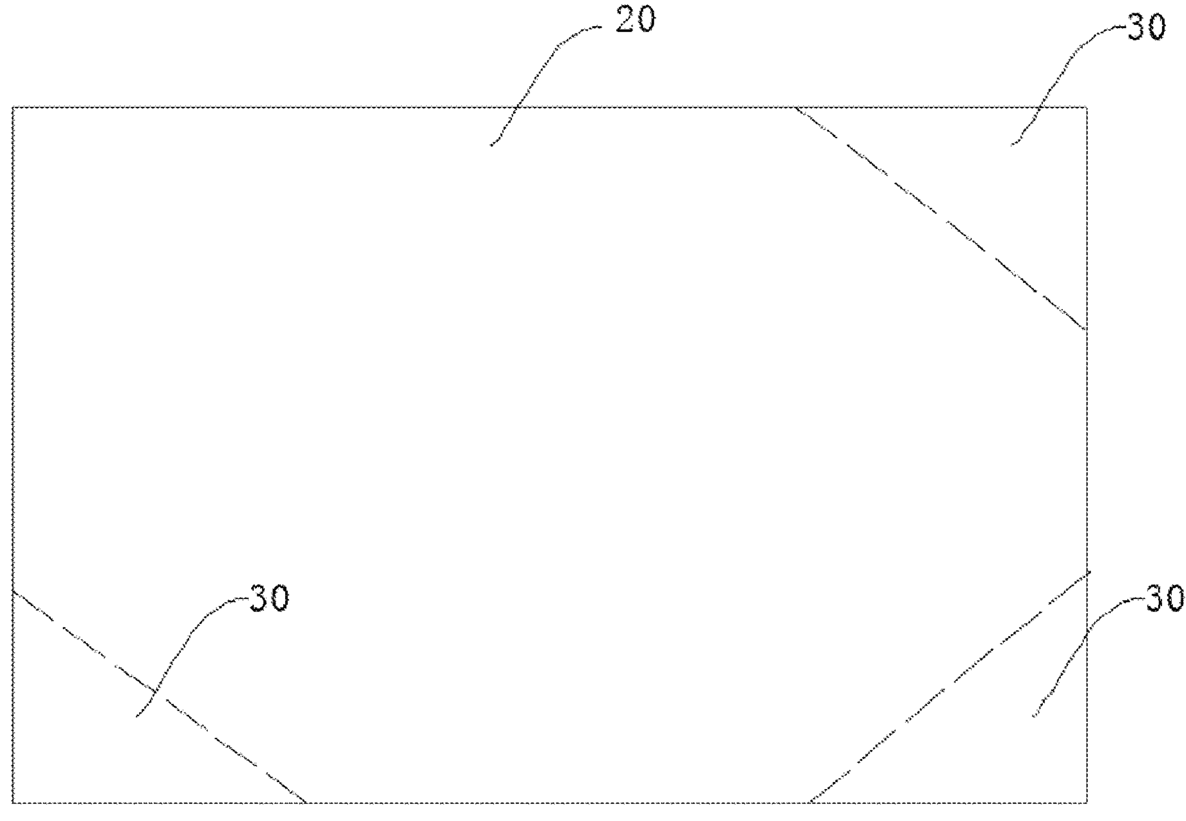
FIG. 9 is a schematic structural diagram of a display panel end and a folded panel end in Embodiment 6 of the present invention.

As shown in FIG. 9, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with three folded panel ends 30, the folded panel ends 30 are formed by folding three corners outwards, and fold axes of the three folded panel ends 30 are not crossed with one another; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 7

Figure 10:
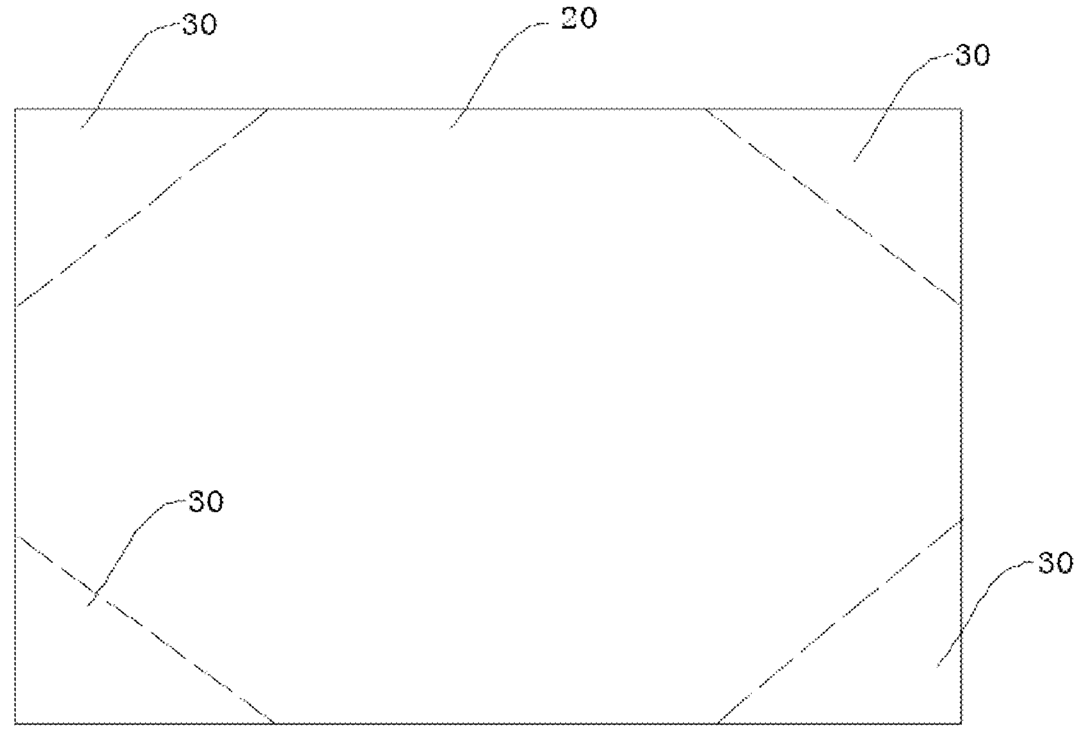
FIG. 10 is a schematic structural diagram of a display panel end and a folded panel end in Embodiment 7 of the present invention.

As shown in FIG. 10, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with four folded panel ends 30, the folded panel ends 30 are formed by folding four corners outwards, and fold axes of the four folded panel ends 30 are not crossed with one another; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 8

Figure 11:
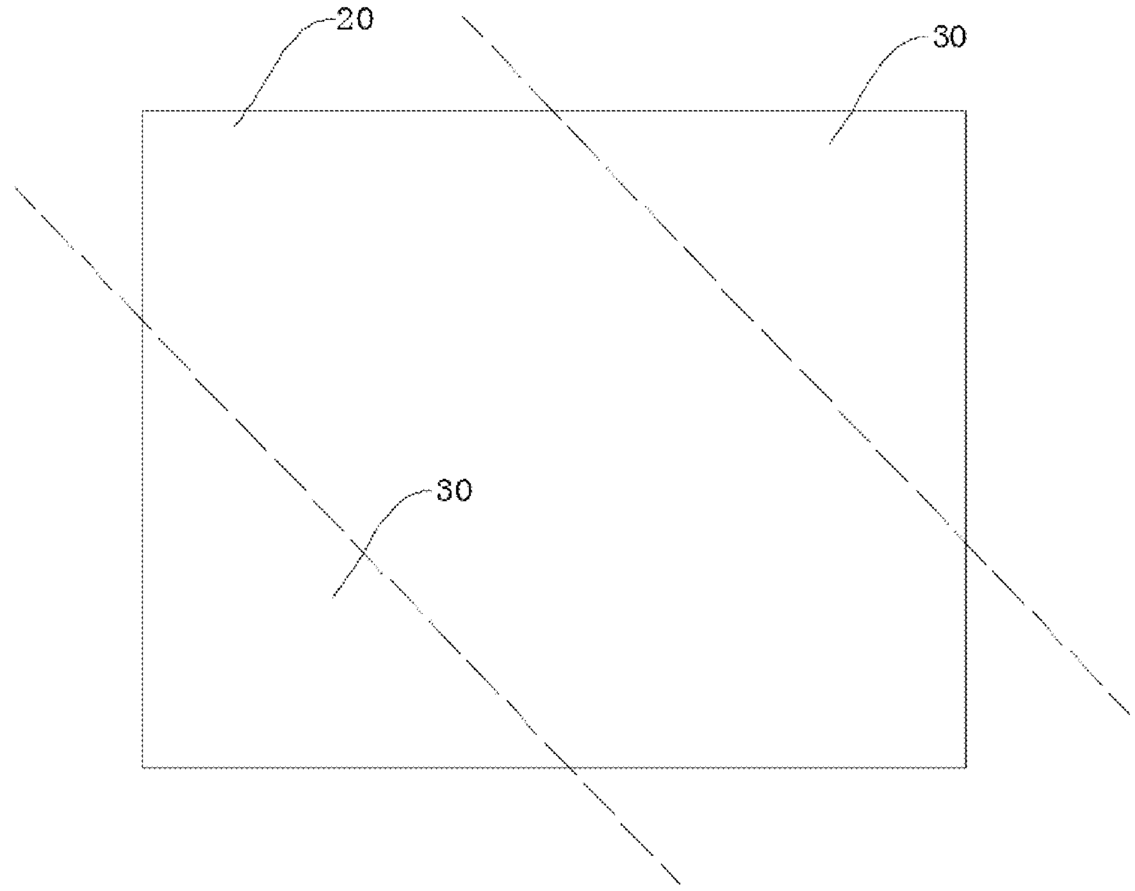
FIG. 11 is a first schematic structural diagram of a display panel end and a folded panel end in Embodiment 8 of the present invention.
Figure 12:
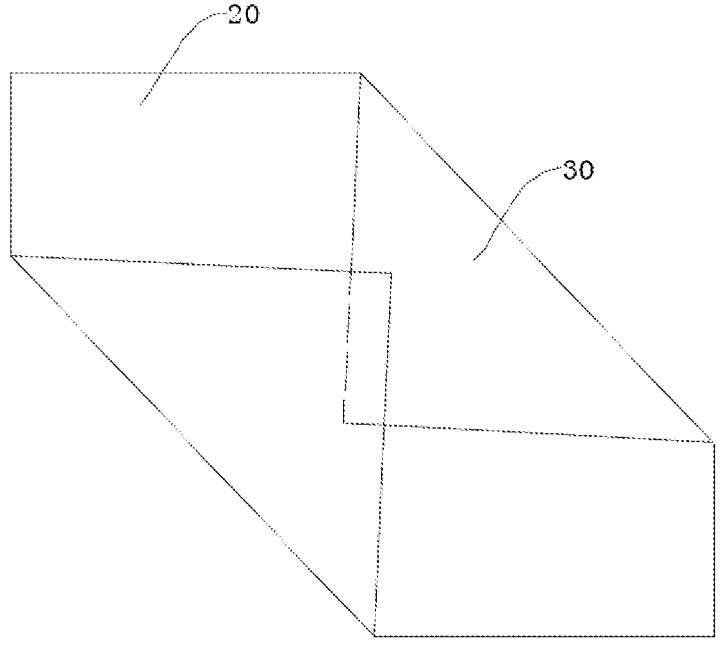
FIG. 12 is a second schematic structural diagram of a display panel end and a folded panel end in Embodiment 8 of the present invention.

As shown in FIG. 11 and FIG. 12, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with two folded panel ends 30, the folded panel ends 30 are formed by folding two opposite corners outwards, the folded panel ends 30 of the foldable OLED panel 10 have mutually stacked parts, and the stacked parts of the folded panel ends 30 are mutually stacked and bonded via an optical adhesive; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 9

Figure 13:
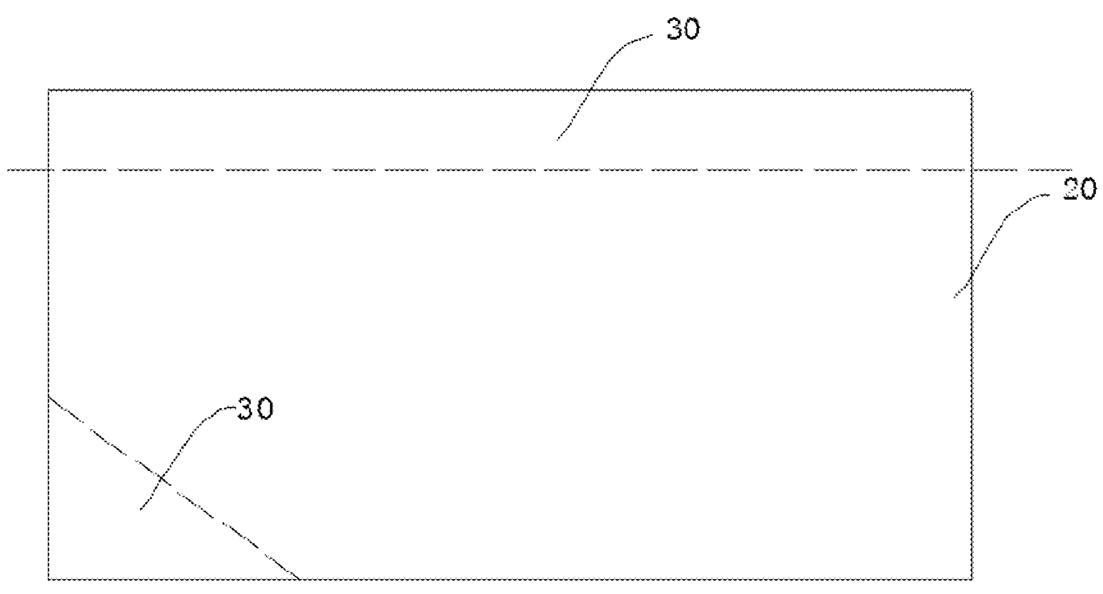
FIG. 13 is a schematic structural diagram of a display panel end and a folded panel end in Embodiment 9 of the present invention.

As shown in FIG. 13, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with two folded panel ends 30, the folded panel ends 30 are formed by folding an edge and one corner outwards, and fold axes of the two folded panel ends 30 are not crossed with each other; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

Embodiment 10

Figure 14:
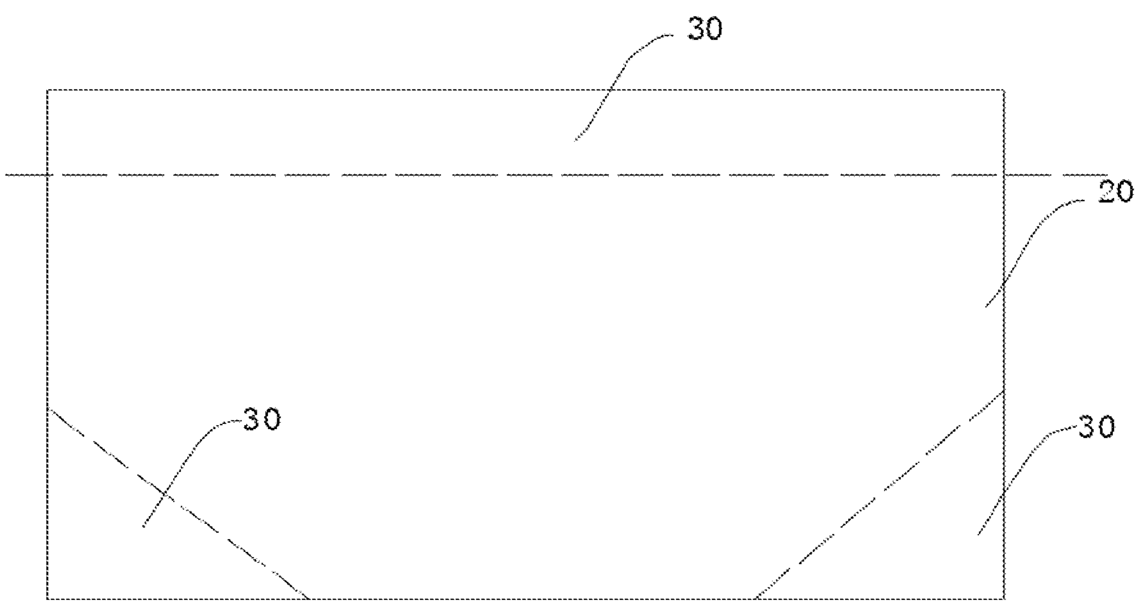
FIG. 14 is a schematic structural diagram of a display panel end and a folded panel end in Embodiment 10 of the present invention.

As shown in FIG. 14, an automotive OLED display screen includes a foldable OLED panel 10, where the foldable OLED panel 10 is of a rectangular structure and includes a display panel end 20 and a folding region, the folding region is folded outwards to form a folded panel end 30, the foldable OLED panel 10 is provided with three folded panel ends 30, the folded panel ends 30 are formed by folding an edge and two corners outwards, and fold axes of the three folded panel ends 30 are not crossed with one another; a back of the display panel end 20 is bonded and fixed to the folded panel end 30; a circular polarizer 40 is attached to a surface of the display panel end 20 via an optical adhesive; a protective cover plate 50 is attached to a surface of the circular polarizer 40 via an optical adhesive; the protective cover plate 50 includes ultra-thin glass 501, a surface of the ultra-thin glass 501 is coated with an explosion-proof film 502, a first PET plastic film 503 is attached to a surface of the explosion-proof film 502 via an optical adhesive, a surface of the first PET plastic film 503 is coated with a hardened anti-fouling film 504, and the ultra-thin glass 501 is bonded to the polarizer 40 via an optical adhesive; a lead wire region 60 is arranged at an end part of the folded panel end 30; and a second PET plastic film 70 is attached to a surface of the folded panel end 30 via an optical adhesive.

A method for manufacturing an automotive OLED display screen, including the following steps:

a): firstly, manufacturing a foldable OLED panel of a standard specification, having a size such as 15 inches, 12 inches, 10 inches, 8 inches, and 6 inches, where the foldable OLED panel includes a polyimide (PI) layer, a thin film transistor (TFT) layer, an OLED layer, an encapsulation layer, and a touch control layer;

b): selecting the foldable OLED panel with the closest size according to a target size of automotive display, and then folding excess parts of the foldable OLED panel outwards, which means that the foldable OLED panel has at least one folded panel end, where a folded front surface has the target size of the automotive OLED panel and is the display panel end;

c): fixing the folded panel end to a back surface of the display panel end via an optical adhesive, where an end part of the folded panel end contains a lead wire region of the display panel end;

d): attaching a circular polarizer to a surface of the display panel end via an optical adhesive; and e): attaching a protective cover plate to a surface of the circular polarizer via an optical adhesive.

Further, the protective cover plate includes ultra-thin glass, a surface of the ultra-thin glass is coated or printed with an explosion-proof film, a PET plastic film is attached to a surface of the explosion-proof film via an optical adhesive, and a surface of the PET plastic film is coated with a hardened anti-fouling film.

Further, a PET protective film is attached to the folded panel end via an optical adhesive for certain protection.

In Embodiment 1 to Embodiment 10 above, the hardened anti-fouling film 504 is the prior art. The hardened anti-fouling film 504 includes a hardened film and an anti-fouling film. The hardened film is applied by means of a coating process, and the anti-fouling film is sprayed or applied by means of a spraying or coating process.

It is worth noting that the explosion-proof film refers to that the ultra-thin glass is coated with explosion-proof ink by intaglio transfer printing equipment or screen printing equipment. A layer of explosion-proof ink is printed by means of intaglio printing. The explosion-proof ink is transparent ink with a thickness of 1-50 microns and is prepared by mixing ink, a curing agent, and a diluent in a certain proportion. After the explosion-proof ink is printed, the impact resistance of the glass may be enhanced, so that even if the glass is broken, it will not fly everywhere. A reference is made to explosion-proof ink mentioned in “Explosion-Proof Coating For Glass Panel And Spraying Method Thereof, And Glass Panel” disclosed in the Chinese Patent Application No. “201611259798.7”. The transparent explosion-proof ink is also prepared by those skilled in the field by conventional technical means. The explosion-proof ink in the present invention is printed by the intaglio transfer printing equipment. For the explosion-proof film, the thickness of the printed ink may be increased through repeated printing to achieve the explosion-proof effect. The intaglio transfer printing equipment may refer to the description in the Chinese patent document 201920381009. X, 201920705690.9, or 201920705687.7.

The above show and describe the basic principle, main features and advantages of the present invention. Those skilled in the art should understand that the present invention is not limited by the above-mentioned embodiments. The above-mentioned embodiments and the descriptions in the specification only illustrate the principle of the present invention. Without departing from the spirit and scope of the present invention, the present invention further has various variations and improvements, all of which fall within the scope of protection of the present invention. The scope of protection of the present invention is defined by the appended claims and their equivalents.

What is claimed is:

1. An automotive organic light-emitting diode (OLED) display screen, comprising a foldable OLED panel, wherein the foldable OLED panel is of a rectangular structure and comprises a display panel end and a folding region, the folding region is folded outwards to form a folded panel end, and the foldable OLED panel is provided with at least one folded panel end;

a back of the display panel end is bonded and fixed to the folded panel end;

a circular polarizer is attached to a surface of the display panel end via a first optical adhesive; and a protective cover plate is attached to a surface of the circular polarizer via a second optical adhesive;

wherein the protective cover plate comprises ultra-thin glass, an explosion-proof film is arranged on a surface of the ultra-thin glass, a first polyethylene terephthalate (PET) plastic film is attached to a surface of the explosion-proof film via a third optical adhesive, a surface of the first PET plastic film is coated with a hardened anti-fouling film, and the ultra-thin glass is bonded to the polarizer via a fourth optical adhesive.

2. The automotive OLED display screen according to claim 1, wherein the foldable OLED panel is provided with at least two folded panel ends; and fold axes of the folded panel ends are not crossed with each other.

3. The automotive OLED display screen according to claim 2, wherein the foldable OLED panel is provided with two folded panel ends, and the folded panel ends are formed by folding two opposite edges outwards.

4. The automotive OLED display screen according to claim 2, wherein the foldable OLED panel is provided with two, three or four folded panel ends, and the folded panel ends are formed by folding two, three or four corners outwards.

5. The automotive OLED display screen according to claim 2, wherein the folded panel ends are formed by folding at least an edge and at least one corner outwards.

6. The automotive OLED display screen according to claim 2, wherein the folded panel ends of the foldable OLED panel have mutually stacked parts, and the stacked parts of the folded panel ends are mutually stacked and bonded via an additional optical adhesive.

7. The automotive OLED display screen according to claim 1, wherein a lead wire region is arranged at an end part of the folded panel end.

8. The automotive OLED display screen according to claim 1, wherein a second PET plastic film is attached to a surface of the folded panel end via a fifth optical adhesive.

9. The automotive OLED display screen according to claim 1, wherein an automotive display outer frame is fixed to an outer side of the display panel end, is in contact with the folded panel end and is located on an outer side of the circular polarizer, an extension portion is arranged on a top surface of the automotive display outer frame, and the extension portion extends towards the display panel end and presses the foldable OLED panel.

10. An automotive organic light-emitting diode (OLED) display screen, comprising a foldable OLED panel, wherein the foldable OLED panel is of a rectangular structure and comprises a display panel end and a folding region, the folding region is folded outwards to form a folded panel end, and the foldable OLED panel is provided with at least one folded panel end;

a back of the display panel end is bonded and fixed to the folded panel end;

a circular polarizer is attached to a surface of the display panel end via a first optical adhesive; and a protective cover plate is attached to a surface of the circular polarizer via a second optical adhesive;

wherein a lead wire region is arranged at an end part of the folded panel end.

11. An automotive organic light-emitting diode (OLED) display screen, comprising a foldable OLED panel, wherein the foldable OLED panel is of a rectangular structure and comprises a display panel end and a folding region, the folding region is folded outwards to form a folded panel end, and the foldable OLED panel is provided with at least one folded panel end;

a back of the display panel end is bonded and fixed to the folded panel end;

a circular polarizer is attached to a surface of the display panel end via a first optical adhesive; and a protective cover plate is attached to a surface of the circular polarizer via a second optical adhesive;

wherein a polyethylene terephthalate (PET) plastic film is attached to a surface of the folded panel end via a third optical adhesive.

* * * * *